(12) United States Patent
Myung et al.

(10) Patent No.: US 8,563,349 B2
(45) Date of Patent: Oct. 22, 2013

(54) METHOD OF FORMING SEMICONDUCTOR DEVICE

(75) Inventors: Jong-Yun Myung, Seoul (KR); Hyuek-Jae Lee, Suwon-si (KR); Ji-Sun Hong, Asan-si (KR); Tae-Je Cho, Hwaseong-si (KR); Un-Byoung Kang, Hwaseong-si (KR); Hyung-Sun Jang, Anyang-si (KR); Eun-Mi Kim, Yongin-si (KR); Jung-Hwan Kim, Bucheon-si (KR); Tae-Hong Min, Gumi-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 13/281,870

(22) Filed: Oct. 26, 2011

(65) Prior Publication Data
US 2012/0156823 A1    Jun. 21, 2012

(30) Foreign Application Priority Data

Dec. 20, 2010   (KR) .......................... 10-2010-0130827

(51) Int. Cl.
*H01L 21/00*   (2006.01)

(52) U.S. Cl.
USPC ...................... 438/65; 257/620; 257/E21.599

(58) Field of Classification Search
USPC ............................................ 438/65, 107, 462
See application file for complete search history.

(56) References Cited

U.S. PATENT DOCUMENTS

| 7,595,220 | B2 | 9/2009 | Weng et al. |
| 8,178,421 | B2 * | 5/2012 | Kikuchi ..................... 438/462 |
| 8,399,272 | B2 * | 3/2013 | Yamae et al. ................. 438/33 |
| 2005/0194670 | A1 | 9/2005 | Kameyama et al. |
| 2006/0223234 | A1 * | 10/2006 | Terayama et al. ............. 438/113 |
| 2008/0213976 | A1 | 9/2008 | Farnworth |
| 2011/0127631 | A1 * | 6/2011 | Kawashima ................. 257/466 |

FOREIGN PATENT DOCUMENTS

| JP | 2005-235859 | 9/2005 |
| KR | 1020060041997 | 5/2006 |

* cited by examiner

*Primary Examiner* — Tony Tran
(74) *Attorney, Agent, or Firm* — F. Chau & Associates, LLC

(57) ABSTRACT

A method of forming a semiconductor device includes preparing a semiconductor substrate having a plurality of chips formed thereon and a scribe lane disposed between the chips, simultaneously forming a groove having a first depth in the scribe lane, and a through hole penetrating the chips and having a second depth. The chips are separated along the groove. The first depth is smaller than the second depth.

5 Claims, 16 Drawing Sheets

METHOD OF FORMING SEMICONDUCTOR DEVICE

CROSS-REFERENCE TO RELATED APPLICATION

This application claims priority under 35 U.S.C. §119 to Korean Patent Application No. 10-2010-0130827 filed on Dec. 20, 2010, the disclosure of which is hereby incorporated by reference herein in its entirety.

BACKGROUND

1. Technical Field

Exemplary embodiments of the inventive concept relate to a method of forming a semiconductor device and relevant devices thereof.

2. Description of Related Art

Research aimed at increasing a wafer sawing process has been underway. However, there is still a need in the art for a wafer sawing method capable of preventing chip cracks.

SUMMARY

Exemplary embodiments of the inventive concept provide a wafer sawing method capable of preventing a chip crack.

Exemplary embodiments of the inventive concept provide a method of forming a semiconductor device employing a wafer sawing method capable of preventing a chip crack.

In accordance with an exemplary embodiment of the inventive concept, a method of forming a semiconductor device is provided. The method includes preparing a semiconductor substrate having a plurality of chips formed thereon and a scribe lane disposed between the chips. The method further includes simultaneously forming a groove having a first depth in the scribe lane, and a through hole penetrating the chips and having a second depth. The chips are separated along the groove. The first depth is smaller than the second depth.

In exemplary embodiments, the forming of the groove may include forming a mask pattern having a first opening and a plurality of second openings on the semiconductor substrate. The semiconductor substrate may be etched using the mask pattern as an etch mask. The first opening may correspond to the through hole. The second openings may correspond to the groove.

In exemplary embodiments, each of the second openings may have a smaller size than the first opening.

In exemplary embodiments, each of the second openings may have a width of about 0.05 to about 0.3 times that of the first opening.

In exemplary embodiments, the second openings may have a distance therebetween smaller than the width of each of the second openings.

In exemplary embodiments, the groove may have a bottom protrusion part aligned between the second openings on its bottom surface. The groove may have a sidewall protrusion part aligned between the second openings on its sidewall.

In exemplary embodiments, the method may further include bonding a light transmitting substrate onto the semiconductor substrate. Separating the chips may include attaching a dicing film on the light transmitting substrate. The semiconductor substrate and the light transmitting substrate may be cut along the groove using a sawing process.

In exemplary embodiments, the groove may be in the shape of a "J" or "W."

In exemplary embodiments, each of the chips may include a photodiode and a micro lens disposed on the photodiode.

In exemplary embodiments, the semiconductor substrate may include a first semiconductor substrate, inner interconnections formed on a first surface of the first semiconductor substrate, and a micro lens formed on a second surface of the first semiconductor substrate. The first surface may face the second surface. The first semiconductor substrate may include a photodiode aligned on the micro lens therein.

In exemplary embodiments, the semiconductor substrate may further include a second semiconductor substrate bonded onto the first semiconductor substrate. The inner interconnections may be formed between the first semiconductor substrate and the second semiconductor substrate.

In exemplary embodiments, the first depth may be smaller than about 0.5 times of the second depth.

In exemplary embodiments, a through electrode filling the through hole may be formed. A connection pattern may be formed on the through electrode.

In exemplary embodiments, one selected from the chips may be mounted on a main board. The through electrode may be electrically connected to the main board via the connection pattern.

In accordance with an exemplary embodiment of the inventive concept, a method of forming a semiconductor device is provided. The method includes preparing a semiconductor substrate having a plurality of chips formed thereon and a scribe lane disposed between the chips. A groove is formed in the scribe lane. The groove has a sidewall protrusion part on its sidewall. The chips are separated along the groove.

In exemplary embodiments, forming the groove may include forming a mask pattern having a plurality of openings aligned in the scribe lane on the semiconductor substrate. The semiconductor substrate may be etched using the mask pattern as an etch mask.

In exemplary embodiments, the sidewall protrusion part may be aligned between the openings. The groove may have a bottom protrusion part aligned between the openings on its bottom surface.

In accordance with an exemplary embodiment of the inventive concept, a method of forming a semiconductor device is provided. The method includes preparing a semiconductor substrate having a plurality of chips formed thereon and a scribe lane disposed between the chips. Each of the chips has a photodiode and a micro lens on the photodiode. A light transmitting substrate is bonded onto the semiconductor substrate. A groove having a first depth is formed in the scribe lane. At the same time, a through hole penetrating the chips and having a second depth is formed. The semiconductor substrate and the light transmitting substrate are cut along the groove using a sawing process to separate the chips. The first depth is smaller than the second depth.

In accordance with an exemplary embodiment of the inventive concept, a method of forming a semiconductor device is provided. The method includes preparing a semiconductor substrate having a plurality of chips formed on a first surface of the semiconductor substrate and a scribe lane disposed between the chips, and each of the chips includes a first insulating layer and a chip pad formed on the first insulating layer, attaching a light transmitting substrate to the first surface of the semiconductor substrate having the chips formed thereon, forming a mask pattern having first openings and second openings on a second surface of the semiconductor substrate located opposite to the first surface, simultaneously forming first grooves having a first depth in a center of the scribe lane, and through holes penetrating the semiconductor substrate and the first insulating layer and having a second depth greater than the first depth to expose the chip pad by etching the semiconductor substrate using the mask pattern as an etch mask. The method further includes removing the mask pattern to expose the first grooves and the through holes, forming insulating spacers on sidewalls of the through holes, forming through electrodes filling the through holes, forming a second insulating layer covering the through electrodes; forming a plurality of connection patterns which penetrate the second insulating layer and which are disposed on a corresponding one of each of the through electrodes, using a sawing process to cut the semiconductor substrate and the light transmitting substrate along the first grooves to form lower grooves along bottoms of the first grooves and which penetrate the semiconductor substrate, the first insulating layer and the light transmitting substrate. The dicing film is exposed to bottoms of the lower grooves and then the dicing film is removed to separate the chips.

BRIEF DESCRIPTION OF THE DRAWINGS

Exemplary embodiments of the inventive concept can be understood in more detail from the following detailed description taken in conjunction with the accompanying drawings in which like reference characters refer to the same parts throughout the different views. The drawings are not necessarily to scale, emphasis instead being placed upon illustrating the principles of exemplary embodiments of the inventive concept. In the drawings.

DETAILED DESCRIPTION OF EXEMPLARY EMBODIMENTS

Figure 1:
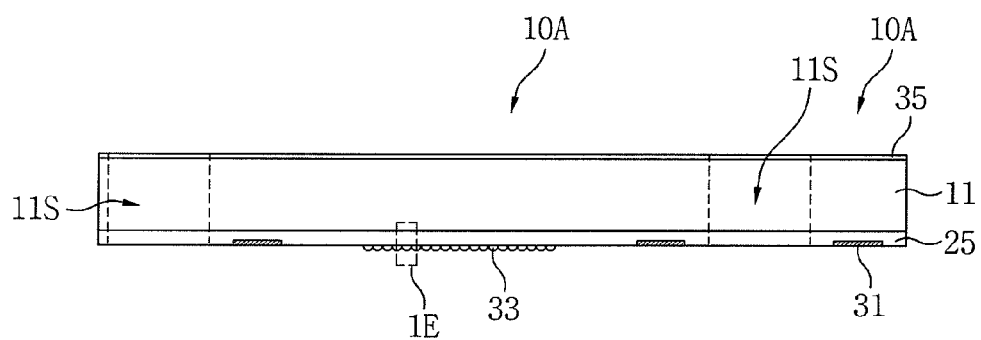
FIGS. 1, 3, 4, 9, 11, and 13 to 16 are cross-sectional views illustrating a method of forming a semiconductor device according to an exemplary embodiment of the inventive concept.

Various exemplary embodiments will now be described more fully with reference to the accompanying drawings in which exemplary embodiments are shown. Exemplary embodiments of the inventive concept may, however, be embodied in different forms and should not be construed as limited to exemplary embodiments set forth herein. In the drawings, the thickness of layers and regions may be exaggerated for clarity. Also, when a layer is referred to as "on" another layer or a substrate, it may be directly formed on another layer or the substrate or an intervening layer may be interposed therebetween. Like reference numerals designate like elements throughout the specification.

Figure 2:
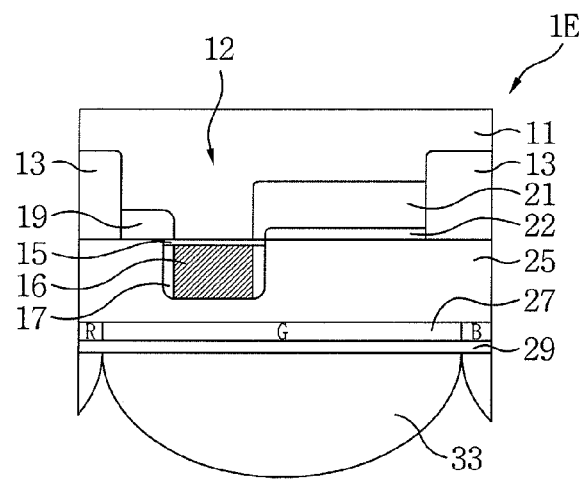
FIG. 2 is an enlarged view of a region 1E of FIG. 1.
Figure 3:
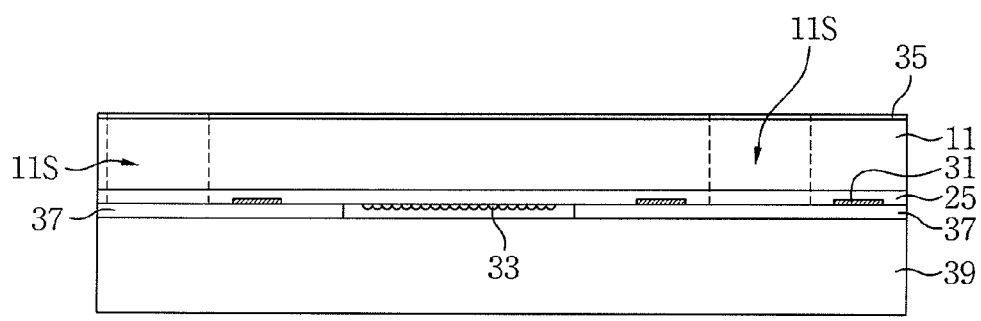
Figure 4:
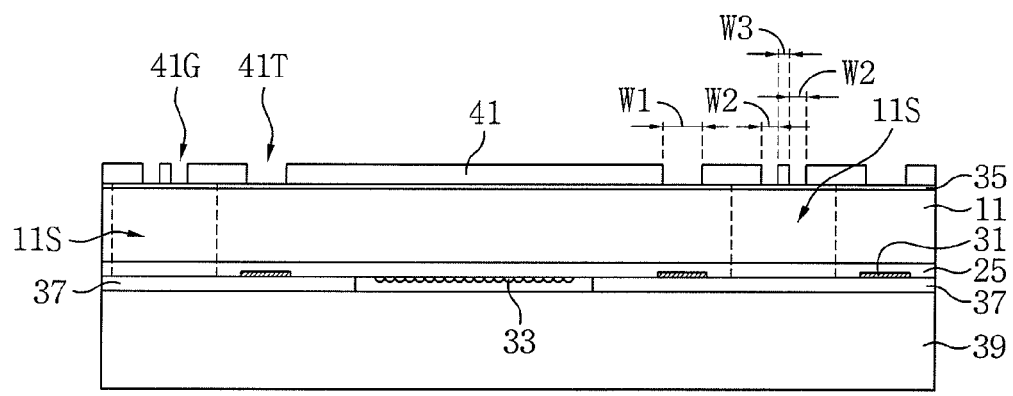
Figure 7:
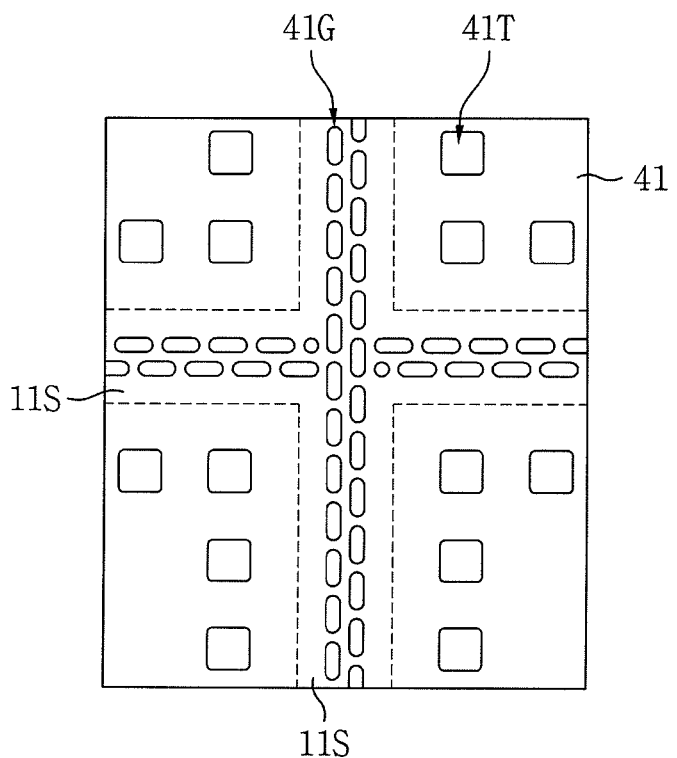
Figure 8:
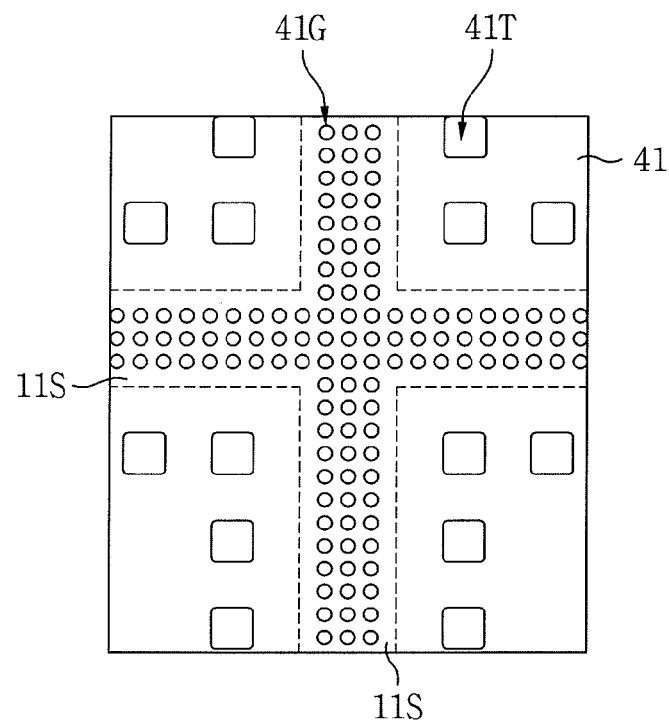
Figure 9:
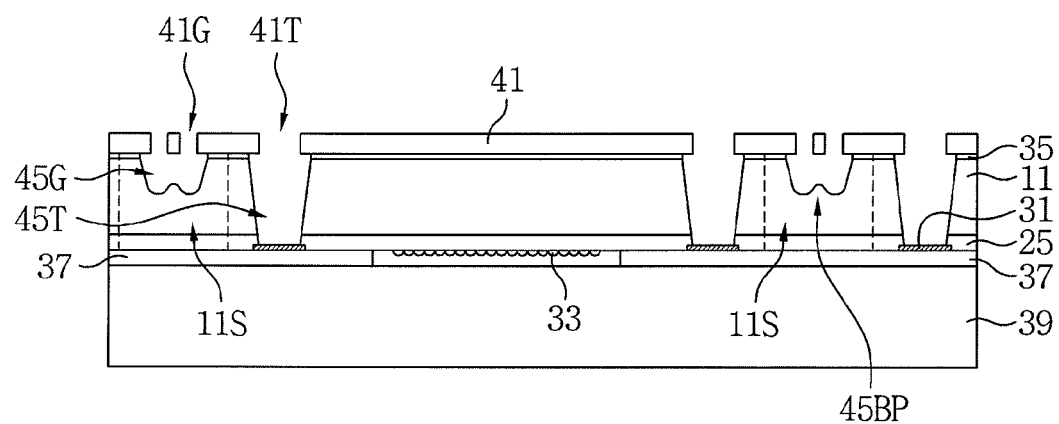
Figure 10:
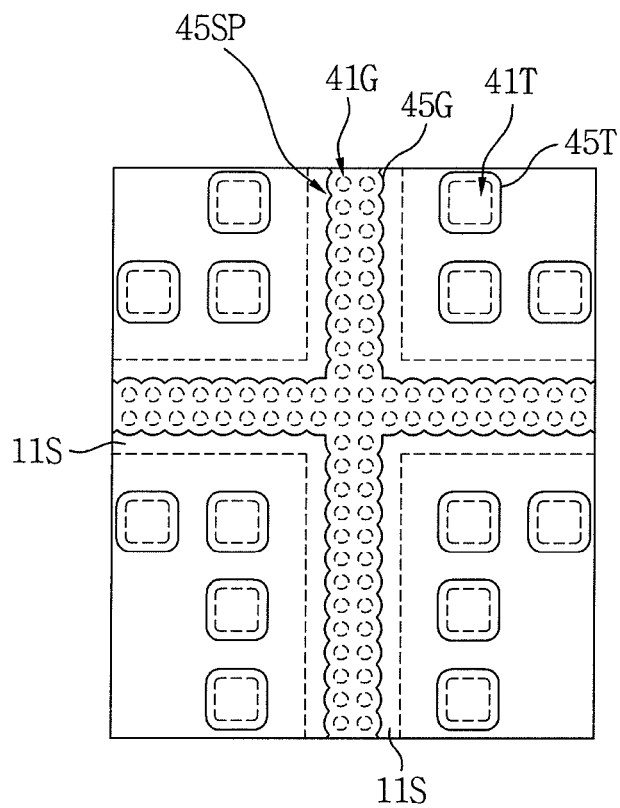
FIG. 10 is a layout diagram corresponding to FIG. 9.
Figure 11:
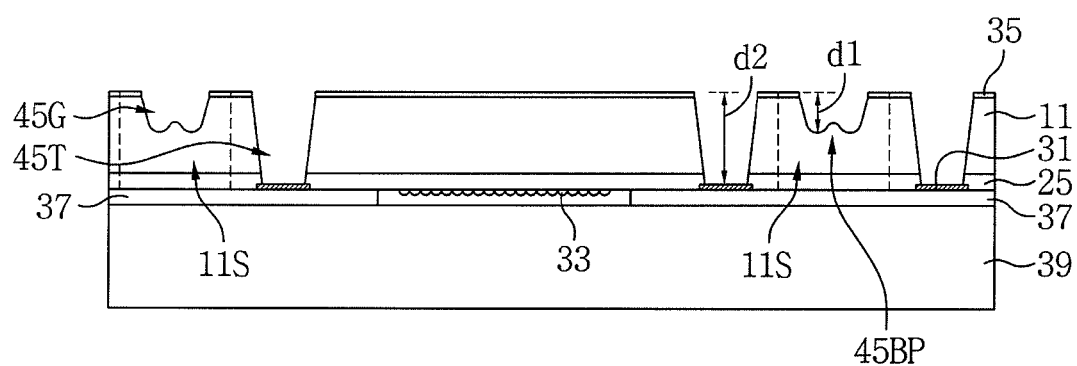
Figure 12:
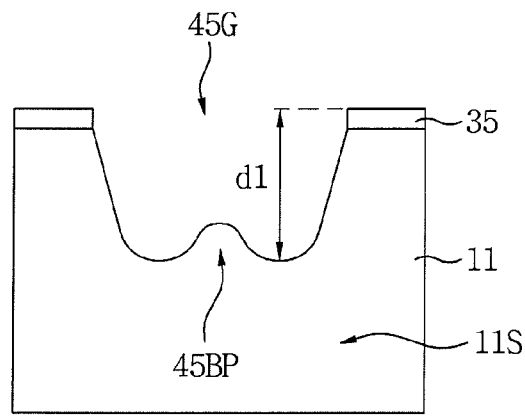
FIG. 12 is an enlarged view of a part of FIG. 11.
Figure 14:
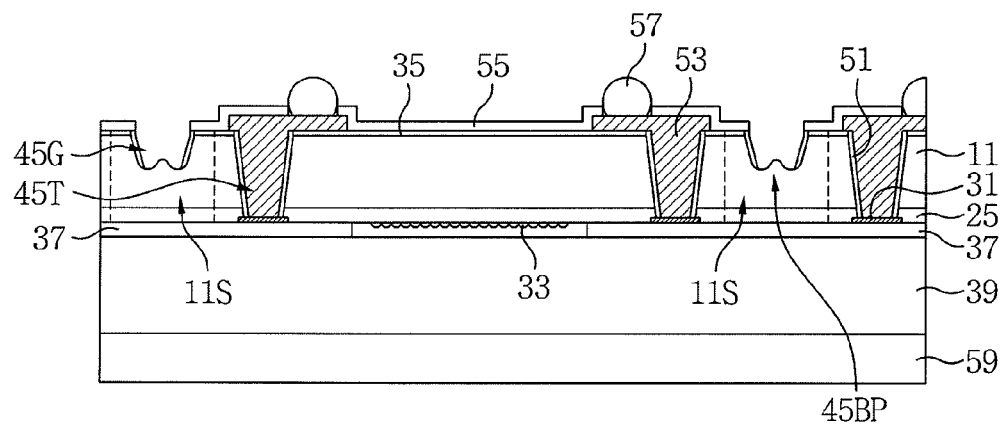
Figure 15:
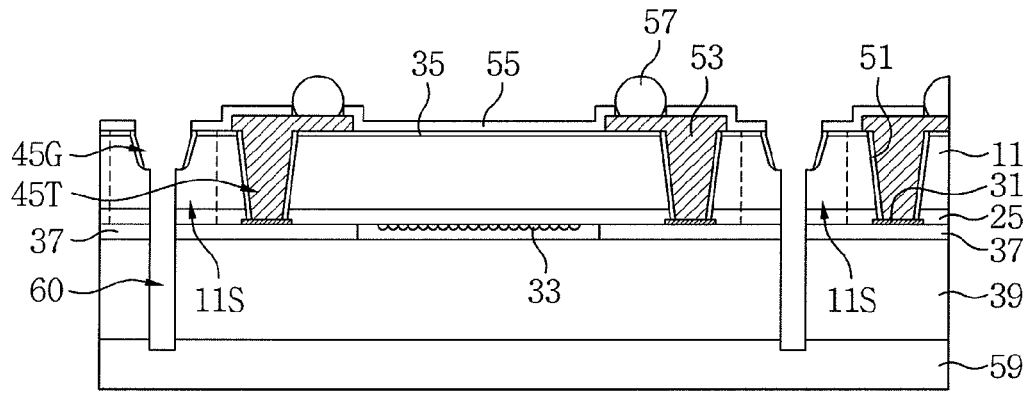
Figure 16:
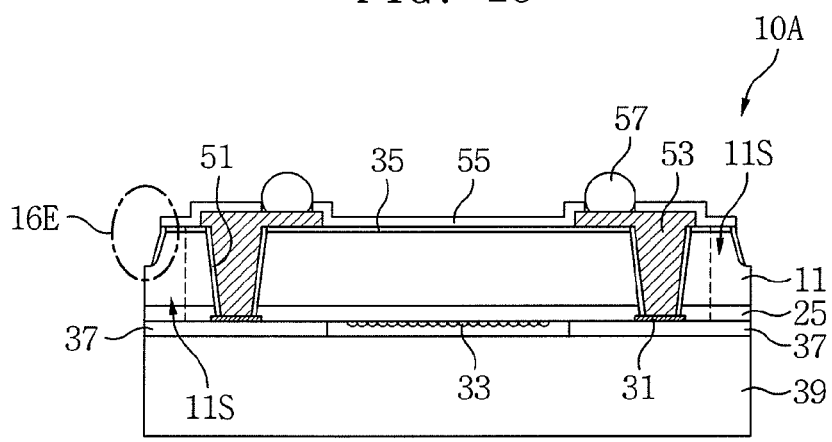
Figure 17:
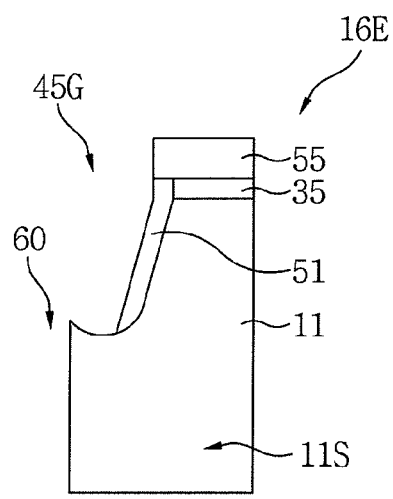
FIG. 17 is an enlarged view of a region 16E of FIG. 16.

FIGS. 1, 3, 4, 9, 11, and 13 to 16 are cross-sectional views illustrating a method of forming a semiconductor device according to an exemplary embodiment of the inventive concept, FIG. 2 is an enlarged view of a region 1E of FIG. 1, FIGS. 5 to 8 are layout diagrams corresponding to FIG. 4, FIG. 10 is a layout diagram corresponding to FIG. 9, FIG. 12 is an enlarged view of a part of FIG. 11, and FIG. 17 is an enlarged view of a region 16E of FIG. 16. A semiconductor device according to the present exemplary embodiment of the inventive concept may be, for example, a complementary metal oxide semiconductor (CMOS) image sensor (CIS).

Referring to FIGS. 1 and 2, a semiconductor substrate 11 having, for example, a plurality of chips 10A and a scribe lane 11S disposed between the chips 10A may be provided. A backside insulating layer 35 covering a surface of the semiconductor substrate 11 may be formed. Each of the chips 10A may include, for example, an active region 12 formed in a predetermined region of the semiconductor substrate 11, an isolation layer 13, a gate dielectric layer 15, a gate electrode 16, a gate spacer 17, a floating diffusion region 19, an NPD 21, a PPD 22, a first insulating layer 25, color filters 27, a second insulating layer 29, chip pads 31, and micro lenses 33.

The NPD 21 and the PPD 22 may be sequentially stacked in the active region 12. The NPD 21 and the PPD 22 may constitute photodiodes. The NPD 21 and the PPD 22 may be aligned at a side of the gate electrode 16. One selected from the micro lenses 33 may be aligned, for example, perpendicular to the photodiodes 21 and 22. The floating diffusion region 19 may be adjacent to a side of the gate electrode 16 to be formed in the active region 12. That is, the gate electrode 16 may be aligned between the photodiodes 21 and 22 and the floating diffusion region 19. The first insulating layer 25 may cover the floating diffusion region 19, the gate electrode 16 and the photodiodes 21 and 22. The chip pads 31 may be formed on the first insulating layer 25. One selected from the chip pads 31 may be electrically connected to the floating diffusion region 19. The semiconductor substrate 11 may be interposed between the backside insulating layer 35 and the first insulating layer 25.

Referring to FIG. 3, a light transmitting substrate 39 may be attached to a surface of the semiconductor substrate 11 using a bonding pattern 37. In this case, the micro lenses 33 may be disposed between the semiconductor substrate 11 and the light transmitting substrate 39. The light transmitting substrate 39 may be formed of, for example, a material layer exhibiting superior transmittance, mechanical strength and chemical stability such as a glass plate or a silicon substrate.

Figure 5:
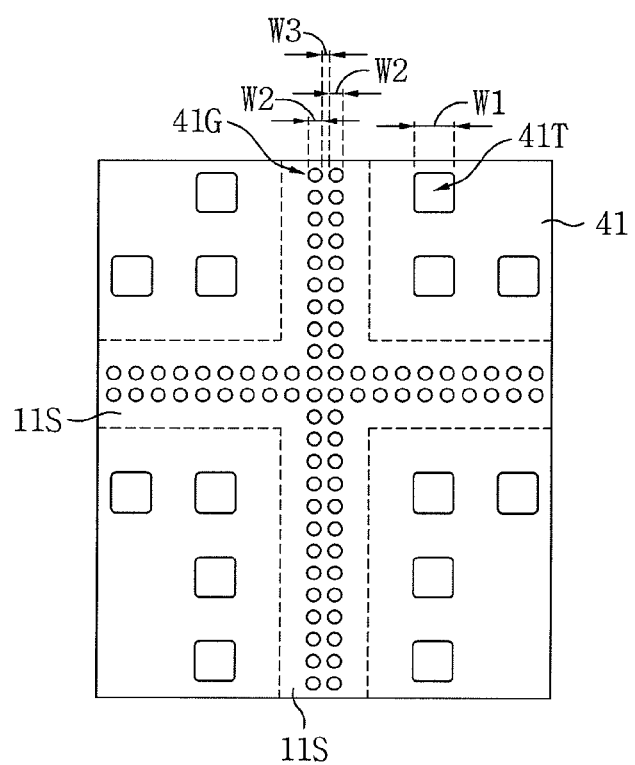
FIGS. 5 to 8 are layout diagrams corresponding to FIG. 4.

Referring to FIGS. 4 and 5, a mask pattern 41 having, for example, first openings 41T and second openings 41G may be formed on the backside insulating layer 35. Each of the first openings 41T may be formed to a first width W1 and to correspond to one selected from the chip pads 31. The second openings 41G may be aligned, for example, in the scribe lane 11S. As illustrated in FIG. 5, the second openings 41G may be aligned in the center of the scribe lane 11S in two rows. The mask pattern 41 may be formed of, for example, a photoresist pattern, a hard mask pattern or a combination thereof.

Each of the second openings 41G may be formed, for example, in a circular form narrower than the first openings 41T. Each of the second openings 41G may be formed to a second width W2. The distance between the second openings 41G may be formed to a third width W3. The second width W2 may be, for example, about 0.05 to about 0.3 times the first width W1. The distance between the second openings 41G may be formed, for example, to be narrower than the second openings 41G. The third width W3 may be formed, for example, smaller than or equal to the second width W2.

Figure 6:
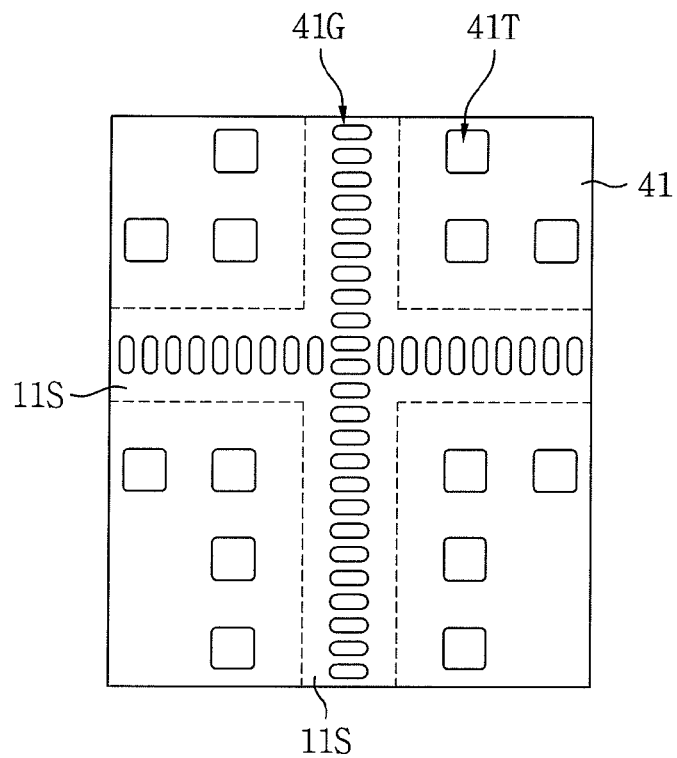

Referring to FIGS. 6 to 8, the second openings 41G may be modified variously. For example, the second openings 41G may be formed in the shape of bars, circles in three rows or a combination thereof.

Referring to FIGS. 9 and 10, when the mask pattern 41 is used as an etch mask to etch the semiconductor substrate 11, through holes 45T and grooves 45G may be formed. The through holes 45T and the grooves 45G may be, for example, simultaneously formed using an etching process. The through holes 45T may penetrate the backside insulating layer 35, the semiconductor substrate 11, and the first insulating layer 25 to expose the chip pads 31. The through holes 45T may be aligned in the first openings 41T. The through holes 45T may expand further than the first openings 41T.

While the through holes 45T are formed, the grooves 45G corresponding to the second openings 41G may be formed. Each of the grooves 45G may be formed in the scribe lane 11S. For example, each of the grooves 45G may be formed along the center of the scribe lane 11S. The grooves 45G may expand further than the second openings 41G. The semiconductor substrate 11 may be exposed to bottoms of the grooves 45G. A bottom protrusion part 45BP aligned between the second openings 41G may be formed on bottom surfaces of the grooves 45G. In this case, the grooves 45G may be formed to be, for example, in the shape of a "J" or "W." Also, a sidewall protrusion part 45SP aligned between the second openings 41G may be formed on sidewalls of the grooves 45G.

Referring to FIGS. 11 and 12, when the mask pattern 41 is removed, the backside insulating layer 35, the grooves 45G and the through holes 45T may be exposed. The grooves 45G may be formed to a first depth d1, and the through holes 45T may be formed to a second depth d2. Here, the first depth d1 may be, for example, smaller than the second depth d2. For example, the first depth d1 may be 0.5 times the second depth d2 or less.

Figure 13:
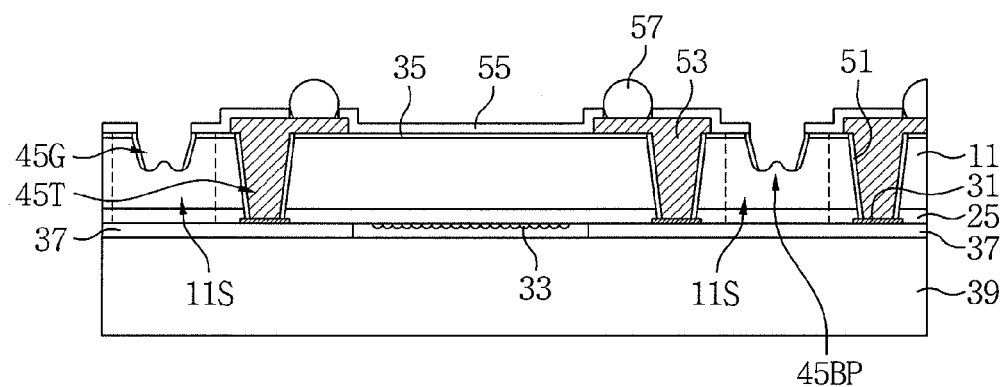

Referring to FIG. 13, insulating spacers 51 may be formed on sidewalls of the through holes 45T. Through electrodes 53 filling the through holes 45T may be formed. A third insulating layer 55 covering the backside insulating layer 35 and the through electrodes 53 may be formed. Connection patterns 57 penetrating the third insulating layer 55 may be formed on the through electrodes 53. The connection patterns 57 may be electrically connected to the chip pads 31 via the through electrodes 53.

The insulating spacers 51 may be formed of, for example, a silicon oxide layer, a silicon nitride layer, a silicon oxynitride layer or a combination thereof. The through electrodes 53 may be formed of a conductive layer such as, for example, a tungsten (W) layer, a titanium (Ti) layer, a titanium nitride (TiN) layer, a tantalum (Ta) layer, a tantalum nitride (TaN) layer, a copper (Cu) layer, an aluminum (Al) layer, a nickel (Ni) layer, a cobalt (Co) layer, a carbon (C) layer, a tin (Sn) layer or a combination thereof. The connection patterns 57 may be formed of, for example, a solder ball, a conductive bump, an anisotropic conductive paste (ACP), an anisotropic conductive film (ACF), a non conductive paste (NCP), a non conductive film (NCF) or a combination thereof. The third insulating layer 55 may be formed of, for example, a silicon oxide layer, a silicon nitride layer, a silicon oxynitride layer, a solder resist or a combination thereof.

Referring to FIGS. 14 and 15, a dicing film 59 may be attached on the light transmitting substrate 39. For example, a sawing process may be used to cut the semiconductor substrate 11 and the light transmitting substrate 39 along the grooves 45G. As a result, lower grooves 60 may be formed along the bottoms of the grooves 45G. The lower grooves 60 may penetrate the semiconductor substrate 11, the first insulating layer 25, the bonding pattern 37 and the light transmitting substrate 39. The dicing film 59 may be exposed to bottoms of the lower grooves 60. The dicing film 59 may function to fix the semiconductor substrate 11 and the light transmitting substrate 39 during the performance of the sawing process.

The grooves 45G may function to prevent a chip crack of the semiconductor substrate 11 during the sawing process. Accordingly, mass production efficiency of the sawing process may be markedly increased.

Referring to FIGS. 16 and 17, the dicing film 59 may be removed to separate the chips 10A. The impression of the grooves 45G and the lower grooves 60 may remain in the longitudinal sections of the chips 10A. The longitudinal section of the chips 10A may be formed, for example, in the shape of a "J."

Figure 18:
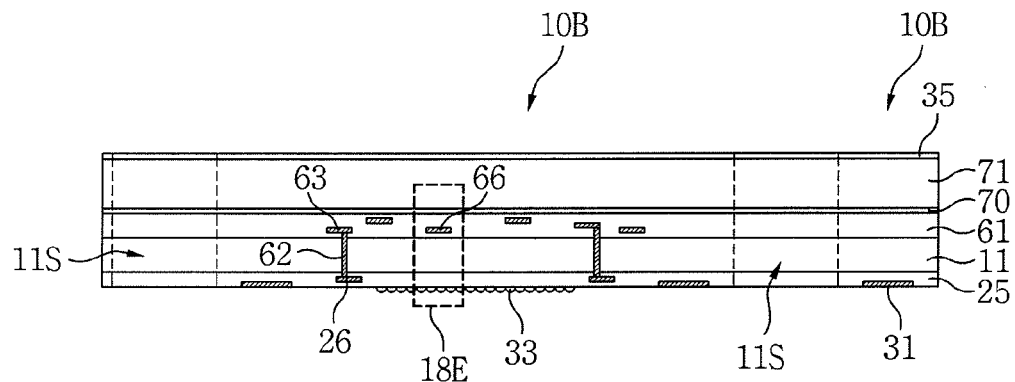
FIGS. 18 and 20 to 22 are cross-sectional views illustrating a method of forming a semiconductor device according to an exemplary embodiment of the inventive concept.
Figure 19:
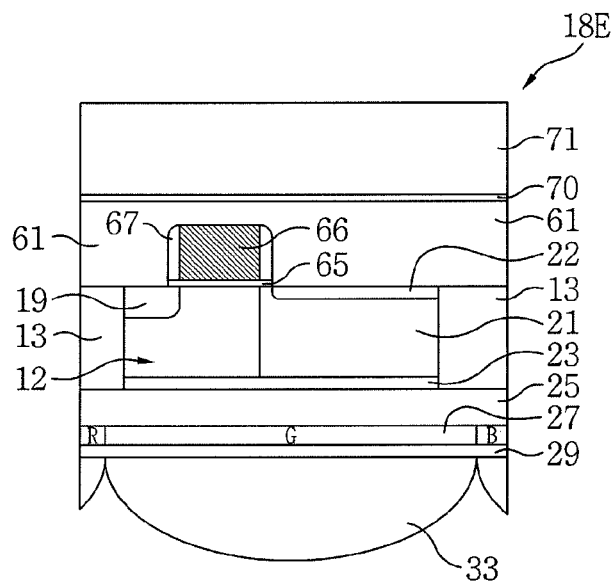
FIG. 19 is an enlarged view of a region 18E of FIG. 18.

FIGS. 18 and 20 to 22 are cross-sectional views illustrating a method of forming a semiconductor device according to an exemplary embodiment of the inventive concept, and FIG. 19 is an enlarged view of a region 18E of FIG. 18. A semiconductor device according to an exemplary embodiment of the inventive concept may be, for example, a backside image sensor (BSI).

Referring to FIGS. 18 and 19, first and second semiconductor substrates 11 and 71 having, for example, a plurality of chips 10B and a scribe lane 11S disposed between the chips 10B may be provided. Each of the chips 10B may include, for example, an active region 12 defined in the first semiconductor substrate 11, an isolation layer 13, a floating diffusion region 19, an NPD 21, a first PPD 22, a second PPD 23, a first insulating layer 25, first inner interconnections 26, color filters 27, a second insulating layer 29, chip pads 31, micro lenses 33, a fourth insulating layer 61, second inner interconnections 62, third inner interconnections 63, a gate dielectric layer 65, a gate electrode 66, a gate spacer 67, a bonding layer 70. A backside insulating layer 35 covering a surface of the second semiconductor substrate 71 may be formed.

The NPD 21 may be interposed between the first PPD 22 and the second PPD 23. The NPD 21, the first PPD 22 and the second PPD 23 may constitute, for example, a photodiode. One selected from the micro lenses 33 may be aligned on the second PPD 23. The second semiconductor substrate 71 may be bonded onto the first semiconductor substrate 11 using, for example, the bonding layer 70.

Figure 20:
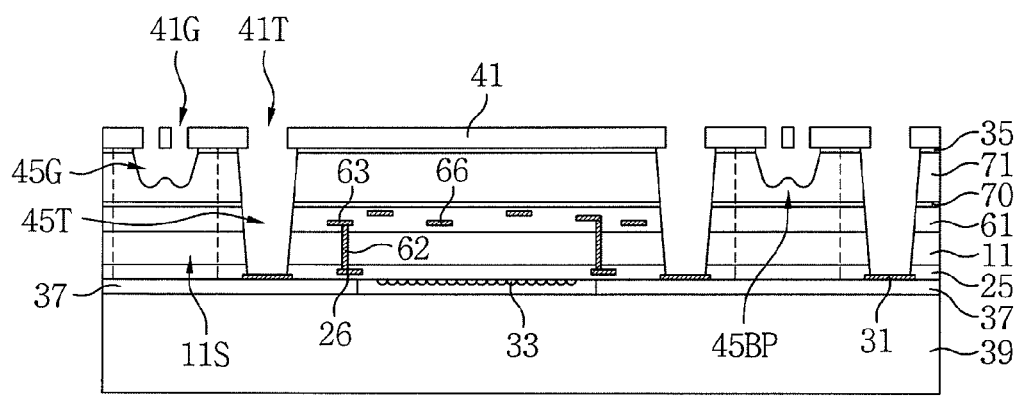

Referring to FIG. 20, a light transmitting substrate 39 may be attached on a surface of the first semiconductor substrate 11 using a bonding pattern 37. In this case, the micro lenses 33 may be disposed between the first semiconductor substrate 11 and the light transmitting substrate 39. A mask pattern 41 having first openings 41T and second openings 41G may be formed on the backside insulating layer 35.

The second semiconductor substrate 71 and the first semiconductor substrate 11 may be etched using the mask pattern 41 as an etch mask to form through holes 45T and grooves 45G. The through holes 45T and the grooves 45G may be, for example, simultaneously formed using an etching process. The through holes 45T may penetrate the backside insulating layer 35, the second semiconductor substrate 71, the bonding layer 70, the fourth insulating layer 61, the first semiconductor substrate 11, and the first insulating layer 25 to expose the chip pads 31. The grooves 45G corresponding to the second openings 41G may be formed while the through holes 45T are formed. The second semiconductor substrate 71 may be exposed to bottoms of the grooves 45G. A bottom protrusion part 45BP aligned between the second openings 41G may be formed on a bottom surface of each of the grooves 45G.

Figure 21:
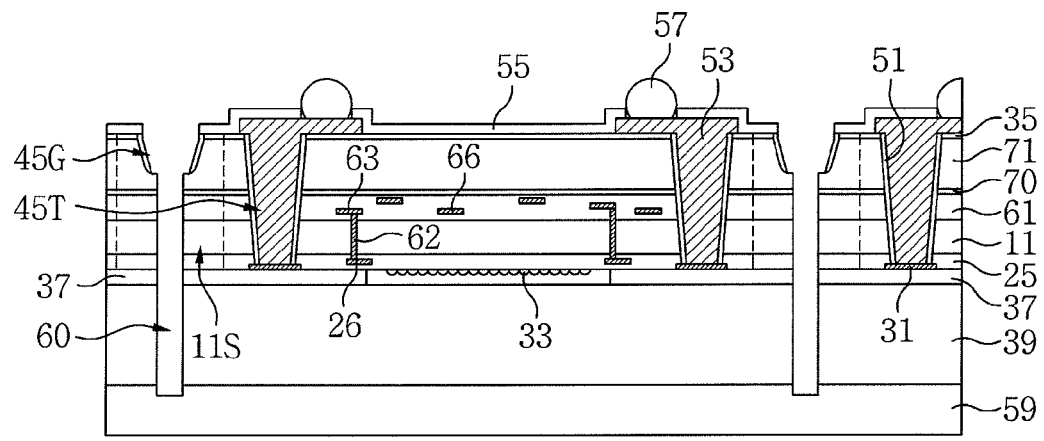
Figure 22:
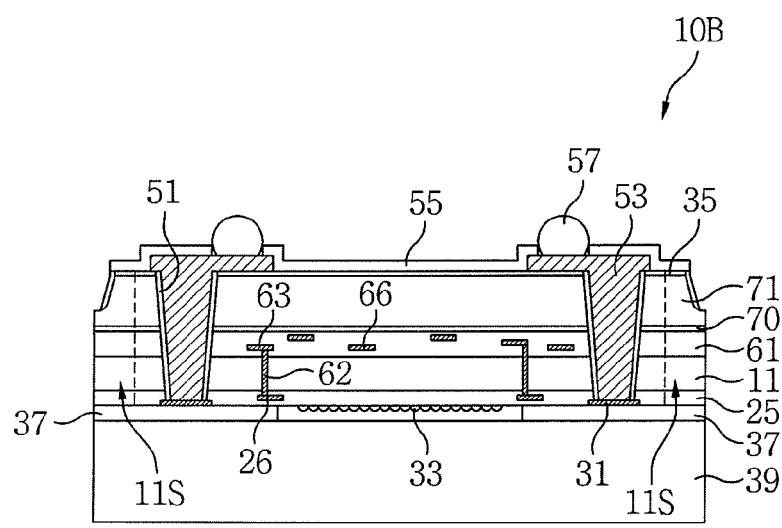

Referring to FIGS. 21 and 22, the mask pattern 41 may be removed to expose the backside insulating layer 35, the grooves 45G and the through holes 45T. Insulating spacers 51 may be formed on sidewalls of the through holes 45T. Through electrodes 53 filling the through holes 45T may be formed. A third insulating layer 55 covering the backside insulating layer 35 and the through electrodes 53 may be formed. Connection patterns 57 penetrating the third insulating layer 55 may be formed on the through electrodes 53.

A dicing film 59 may be attached on the light transmitting substrate 39. The second semiconductor substrate 71, the first semiconductor substrate 11 and the light transmitting substrate 39 may be cut along the grooves 45G using, for example, a sawing process. As a result, lower grooves 60 may be formed along bottoms of the grooves 45G. The lower grooves 60 may penetrate the second semiconductor substrate 71, the bonding layer 70, the fourth insulating layer 61, the first semiconductor substrate 11, the first insulating layer 25, the bonding pattern 37 and the light transmitting substrate 39. The dicing film 59 may be exposed to bottoms of the lower grooves 60. Afterwards, the dicing film 59 may be removed to separate the chips 10B.

The grooves 45G may function to prevent a chip crack of the second semiconductor substrate 71 during the performance of the sawing process. Accordingly, mass production efficiency of the sawing process may be markedly increased.

FIGS. 23 to 26 are cross-sectional views illustrating a method of forming a semiconductor device according to an exemplary embodiment of the inventive concept.

Figure 23:
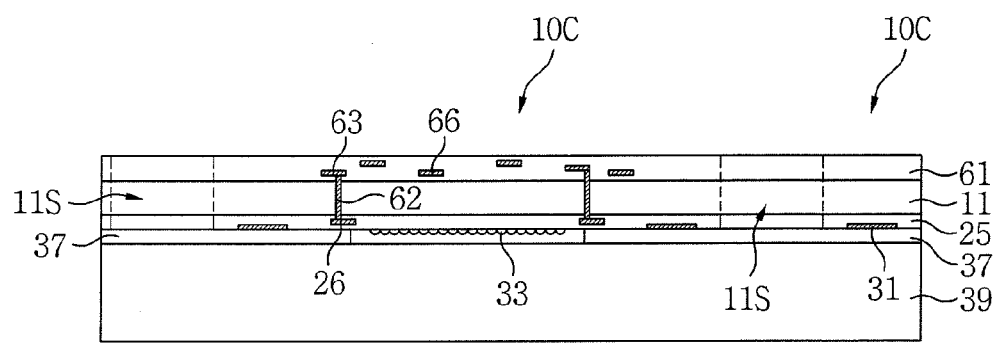
FIGS. 23 to 26 are cross-sectional views illustrating a method of forming a semiconductor device according to an exemplary embodiment of the inventive concept.

Referring to FIG. 23, a semiconductor substrate 11 having a plurality of chips 10C and a scribe lane 11S disposed between the chips 10C may be provided. Each of the chips 10C may include, for example, a first insulating layer 25, first inner interconnections 26, chip pads 31, micro lenses 33, a fourth insulating layer 61, second inner interconnections 62, third inner interconnections 63, and a gate electrode 66. In the embodiment, the bonding layer (70 of FIG. 18), the second semiconductor substrate (71 of FIG. 18) and the backside insulating layer (35 of FIG. 18) may be omitted.

Figure 24:
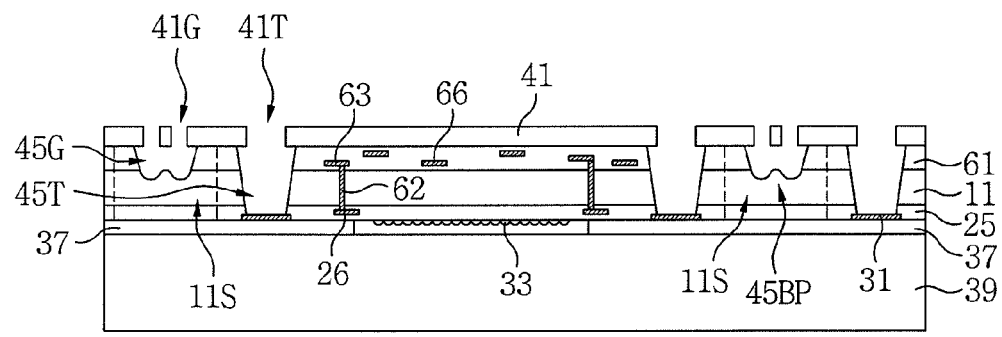

Referring to FIG. 24, a light transmitting substrate 39 may be attached to a surface of the semiconductor substrate 11 using a bonding pattern 37. In this case, the micro lenses 33 may be disposed between the semiconductor substrate 11 and the light transmitting substrate 39. A mask pattern 41 having first openings 41T and second openings 41G may be formed on the fourth insulating layer 61. The mask pattern 41 may be used as an etch mask to etch the fourth insulating layer 61 and the semiconductor substrate 11, so that through holes 45T and grooves 45G may be formed. The through holes 45T and the grooves 45G may be, for example, simultaneously formed using an etching process.

The through holes 45T may penetrate the fourth insulating layer 61, the semiconductor substrate 11 and the first insulating layer 25 to expose the chip pads 31. While the through holes 45T are formed, the grooves 45G corresponding to the second openings 41G may be formed. The semiconductor substrate 11 may be exposed to bottoms of the grooves 45G. A bottom protrusion part 45BP aligned between the second openings 41G may be formed on bottom surfaces of the grooves 45G.

Figure 25:
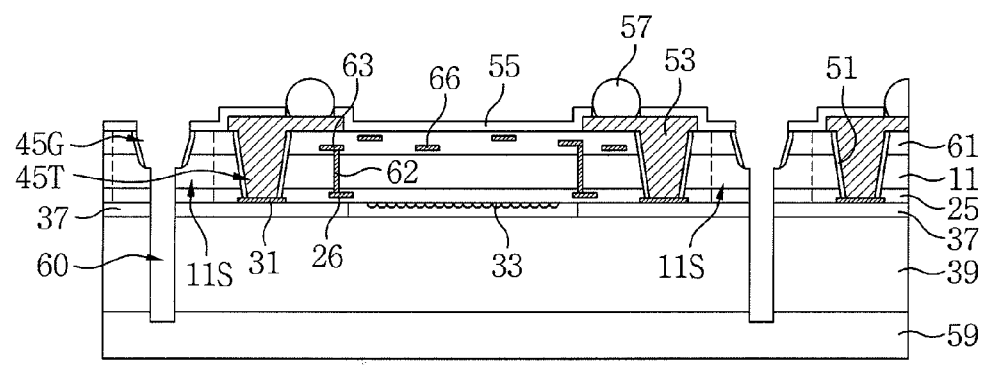
Figure 26:
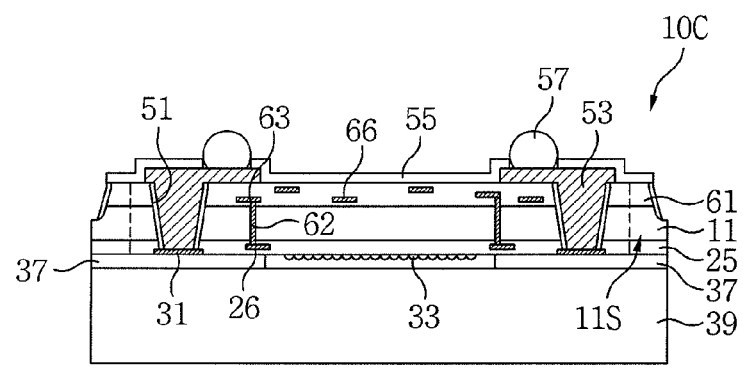

Referring to FIGS. 25 and 26, the mask pattern 41 may be removed to expose the fourth insulating layer 61, the grooves 45G and the through holes 45T. Insulating spacers 51 may be formed on sidewalls of the through holes 45T. Through electrodes 53 filling the through holes 45T may be formed. A third insulating layer 55 covering the fourth insulating layer 61 and the through electrodes 53 may be formed. Connection patterns 57 penetrating the third insulating layer 55 may be formed on the through electrodes 53.

A dicing film 59 may be attached on the light transmitting substrate 39. For example, a sawing process may be used to cut the semiconductor substrate 11 and the light transmitting substrate 39 along the grooves 45G. As a result, lower grooves 60 may be formed along bottoms of the grooves 45G. The lower grooves 60 may penetrate the semiconductor substrate 11, the first insulating layer 25, the bonding pattern 37 and the light transmitting substrate 39. The dicing film 59 may be exposed to bottoms of the lower grooves 60. Afterwards, when the dicing film 59 is removed, the chips 10C may be separated.

FIGS. 27 to 34 are cross-sectional views illustrating a method of forming a semiconductor device according to an exemplary embodiment of the inventive concept.

Figure 27:
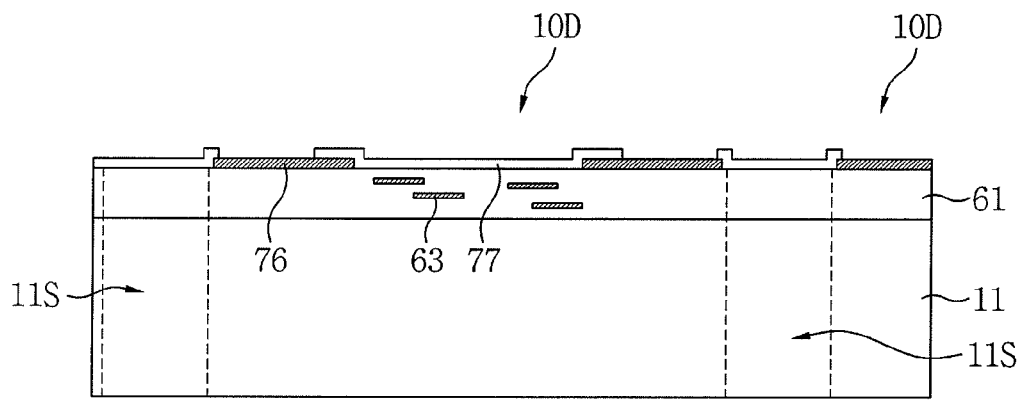
FIGS. 27 to 34 are cross-sectional views illustrating a method of forming a semiconductor device according to an exemplary embodiment of the inventive concept.

Referring to FIG. 27, a semiconductor substrate 11 having, for example, a plurality of chips 10D and scribe lanes 11S disposed between the chips 10D may be provided. Each of the chips 10D may include, for example, a fourth insulating layer 61, third inner interconnections 63, re-interconnection pads 76 and a fifth insulating layer 77. The fourth insulating layer 61 may be formed to cover a surface of the semiconductor substrate 11. The re-interconnection pads 76 and the fifth insulating layer 77 may be formed on the fourth insulating layer 61. The fifth insulating layer 77 may cover edges of the re-interconnection pads 76. The fourth insulating layer 61 may include the third inner interconnections 63 therein. While active/passive elements of various types (not shown) including the third inner interconnections 63 may be formed in the fourth insulating layer 61, the description thereof will be omitted for clarity.

Figure 28:
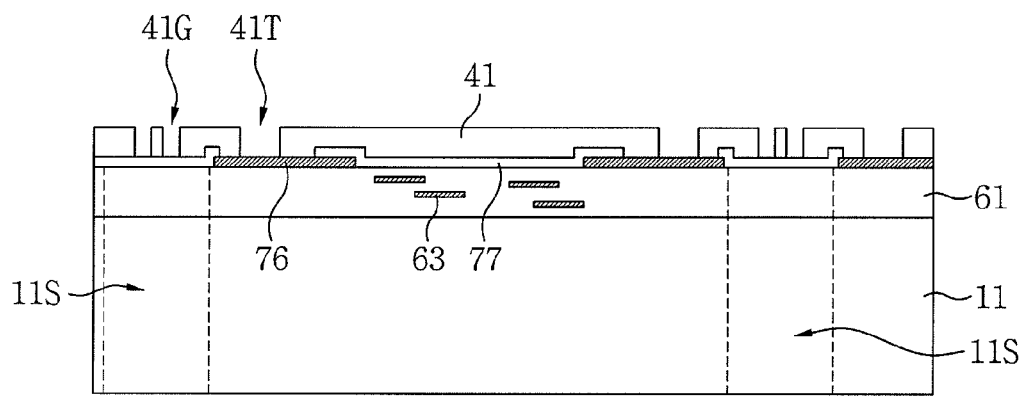

Referring to FIG. 28, a mask pattern 41 having first openings 41T and second openings 41G may be formed on the re-interconnection pads 76 and the fifth insulating layer 77. The first openings 41T may be aligned on the re-interconnection pads 76, and the second openings 41G may be aligned on the scribe lanes 11S.

Figure 29:
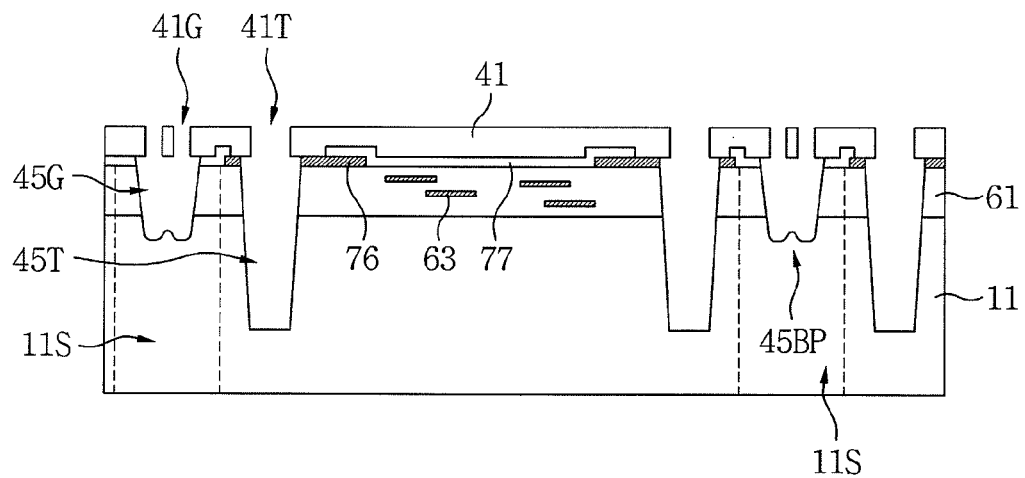

Referring to FIG. 29, the mask pattern 41 may be used as an etch mask to etch the fourth insulating layer 61 and the semiconductor substrate 11, so that through holes 45T and grooves 45G may be formed. The through holes 45T and the grooves 45G may be, for example, simultaneously formed using an etching process.

The through holes 45T may penetrate the re-interconnection pads 76, the fourth insulating layer 61, and the semiconductor substrate 11. The semiconductor substrate 11 may be exposed to bottoms of the through holes 45T. The grooves 45G may penetrate the fifth insulating layer 77, the fourth insulating layer 61 and the semiconductor substrate 11. The semiconductor substrate 11 may be exposed to bottoms of the grooves 45G. The grooves 45G may be formed at a level higher than the bottoms of the through holes 45T. A bottom protrusion part 45BP aligned between the second openings 41G may be formed on a bottom surface of each groove 45G.

Figure 30:
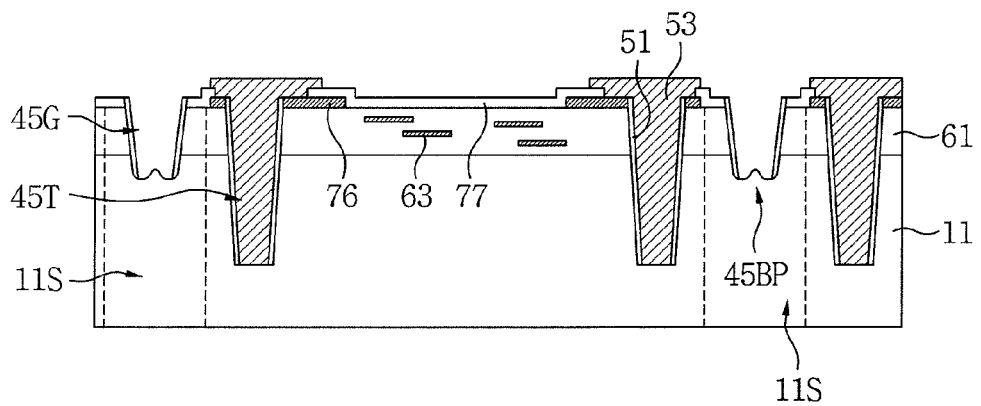
Figure 31:
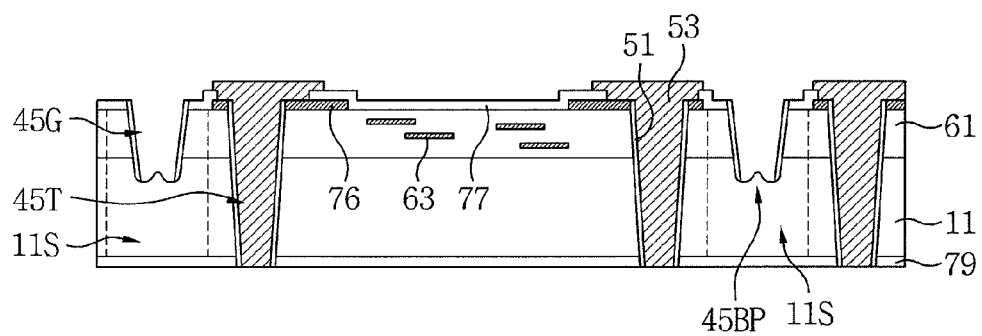

Referring to FIGS. 30 and 31, the mask pattern 41 may be removed to expose the fourth insulating layer 61, the grooves 45G and the through holes 45T. Insulating spacers 51 may be formed on sidewalls of the through holes 45T. Through electrodes 53 filling the through holes 45T may be formed. The through electrodes 53 may be in contact with the re-interconnection pads 76. A backside of the semiconductor substrate 11 may be polished to expose the through electrodes 53. A sixth insulating layer 79 may be formed on the backside of the semiconductor substrate 11.

Figure 32:
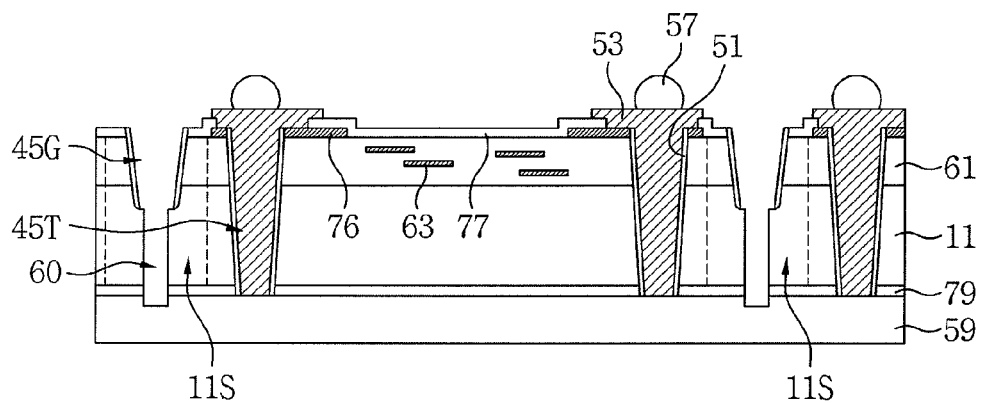

Referring to FIG. 32, connection patterns 57 may be formed on the through electrodes 53. A dicing film 59 may be attached on the sixth insulating layer 79. The semiconductor substrate 11 may be cut along the grooves 45G using, for example, a sawing process. As a result, lower grooves 60 may be formed along bottoms of the grooves 45G. The lower grooves 60 may penetrate the semiconductor substrate 11 and the sixth insulating layer 79. The dicing film 59 may be exposed to bottoms of the lower grooves 60.

Figure 33:
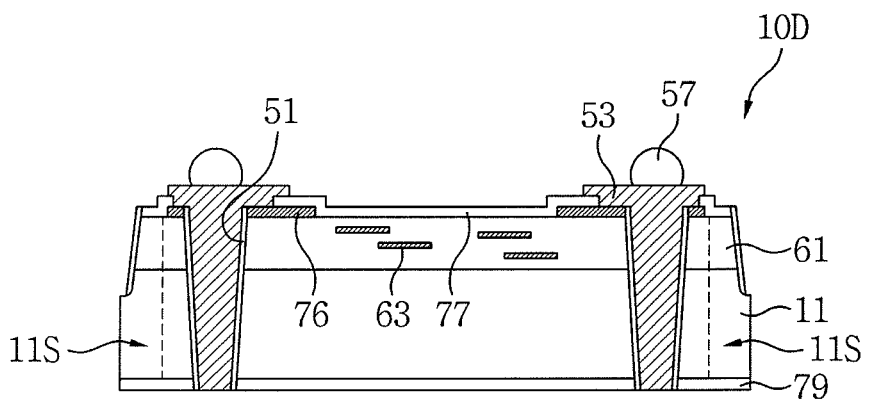
Figure 34:
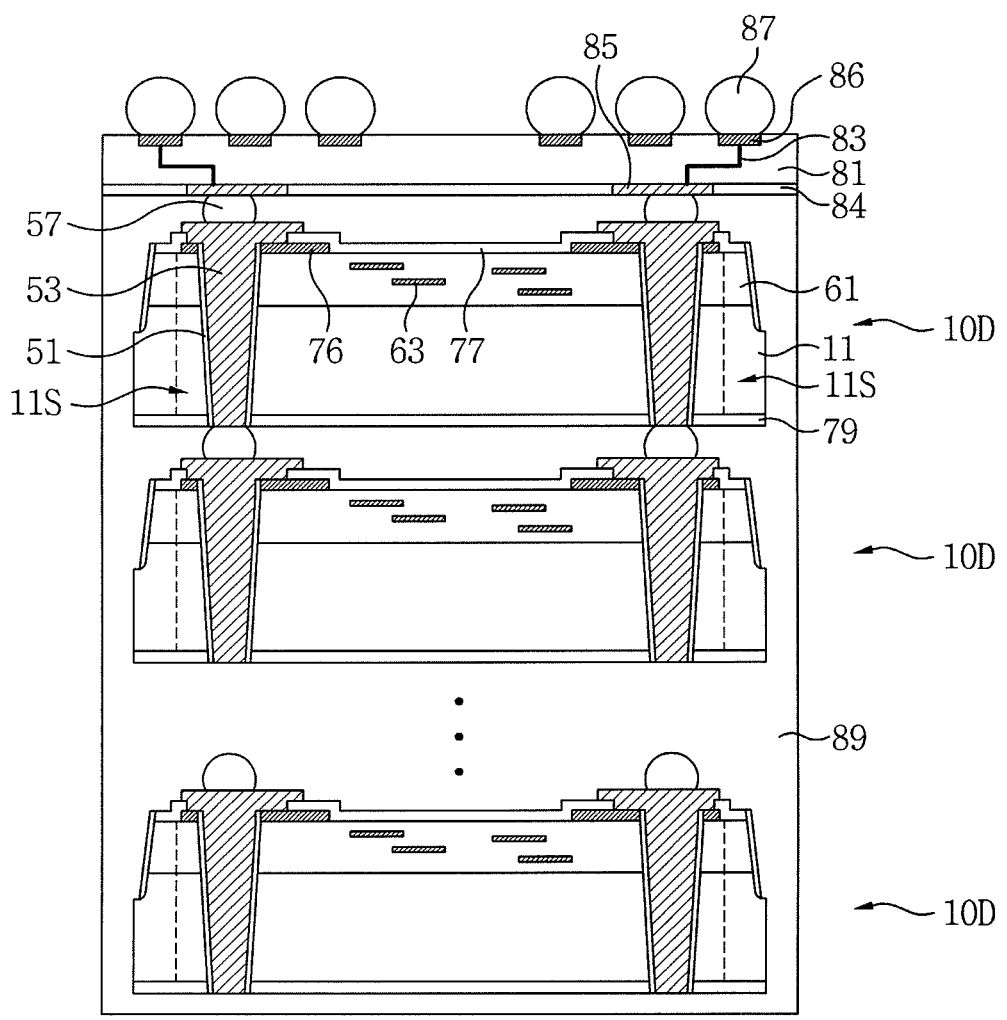

Referring to FIGS. 33 and 34, the dicing film 59 may be removed to separate the chips 10D. The chips 10D may be sequentially stacked on a package substrate 81. The connection patterns 57 may be attached to first substrate pads 85 in the package substrate 81. An encapsulating material 89 covering the chips 10D may be formed on the package substrate 81.

Second substrate pads 86, first substrate pads 85 and substrate interconnections 83 connected between the second substrate pads 86 may be formed in the package substrate 81. The package substrate 81 may be covered with a substrate insulating layer 84. External terminals 87 may be formed on the package substrate 81. The external terminals 87 may be electrically connected to the through electrodes 53 via the second substrate pads 86, the substrate interconnections 83, the first substrate pads 85 and the connection pads 57.

Figure 35:
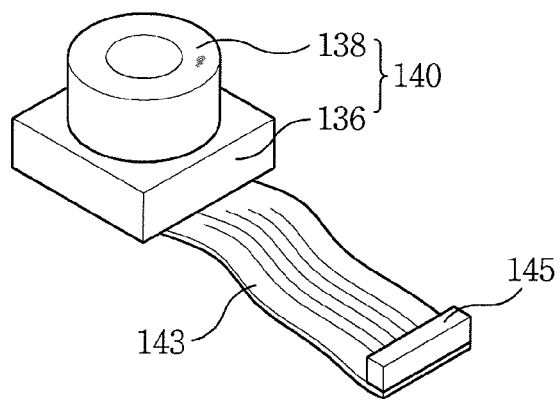
FIG. 35 is a perspective view of a camera module according to an exemplary embodiment of the inventive concept.
Figure 36:
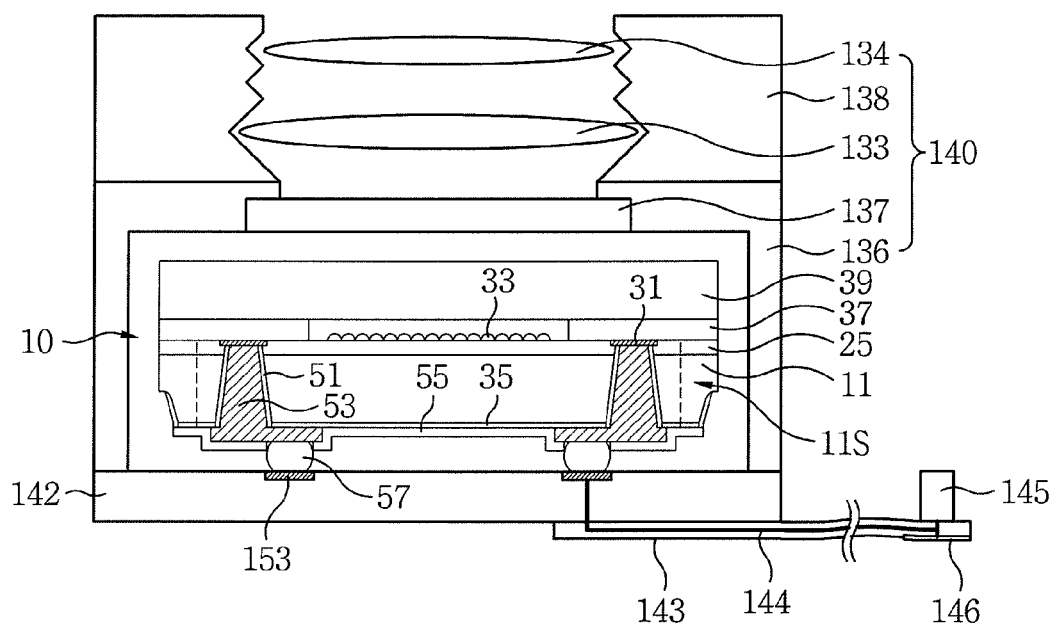
FIG. 36 is a cross-sectional view of the camera module according to an exemplary embodiment of the inventive concept.

FIG. 35 is a perspective view of a camera module according to an exemplary embodiment of the inventive concept, and FIG. 36 is a cross-sectional view of the camera module.

Referring to FIGS. 35 and 36, the camera module may include, for example, a case 140, first and second printed circuit boards (PCBs) 142 and 143 and a semiconductor device 10. The semiconductor device 10 may include, for example, a CIS having a similar constitution to that described with reference to FIGS. 1 to 17.

The case 140 may include, for example, a sensor case 136 having a light transmitting window 137, and a lens holder 138 mounted on the sensor case 136. First and second lenses 133 and 134 may be disposed in the lens holder 138. The sensor case 136 may be mounted on the first PCB 142. A second PCB 143 may be connected to a surface of the first PCB 142. External terminals 145 and 146 may be provided on ends of the second PCB 143. In exemplary embodiments, the first PCB 142 may be referred to as a main board.

The semiconductor device 10 may be mounted on the first PCB 142. The semiconductor device 10 may include, for example, a semiconductor substrate 11, a first insulating layer 25, chip pads 31, micro lenses 33, backside insulating layers 35, a bonding pattern 37, a light transmitting substrate 39, insulating spacers 51, through electrodes 53, a third insulating layer 55, and connection patterns 57. While the semiconductor device 10 may have a similar constitution to that described with reference to FIGS. 1 to 17, the description thereof will be omitted for clarity. The micro lenses 33 may be aligned on the light transmitting window 137. That is, the light transmitting window 137 may be aligned on the photodiodes (21 and 22 of FIG. 2).

The connection devices 57 may be connected to bond fingers 153 formed in the first PCB 142. The through electrodes 53 may be electrically connected to the first PCB 142 via the connection patterns 57 and bond fingers 153. The bond fingers 153 may be electrically connected to the external terminals 145 and 146 via an internal interconnection 144 in the first and second PCBs 142 and 143. The external terminals 145 and 146 may include, for example, a multi-connector 145 and/or a multi-tap 146. In some embodiments, the second PCB 143 may be omitted. Furthermore, the first PCB 142 may include other external terminals such as, for example, a ball grid array (BGA), a lead grid array (LGA), a pin grid array (PGA) or a combination thereof.

The first and second PCBs 142 and 143 may be, for example, a rigid PCB, a flexible PCB or a rigid-flexible PCB. For example, the first PCB 142 may be a rigid PCB, and the second PCB 143 may be a flexible PCB.

In exemplary embodiments, a backside image sensor having a similar constitution to that described with reference to FIGS. 18 to 26 may be employed.

Figure 37:
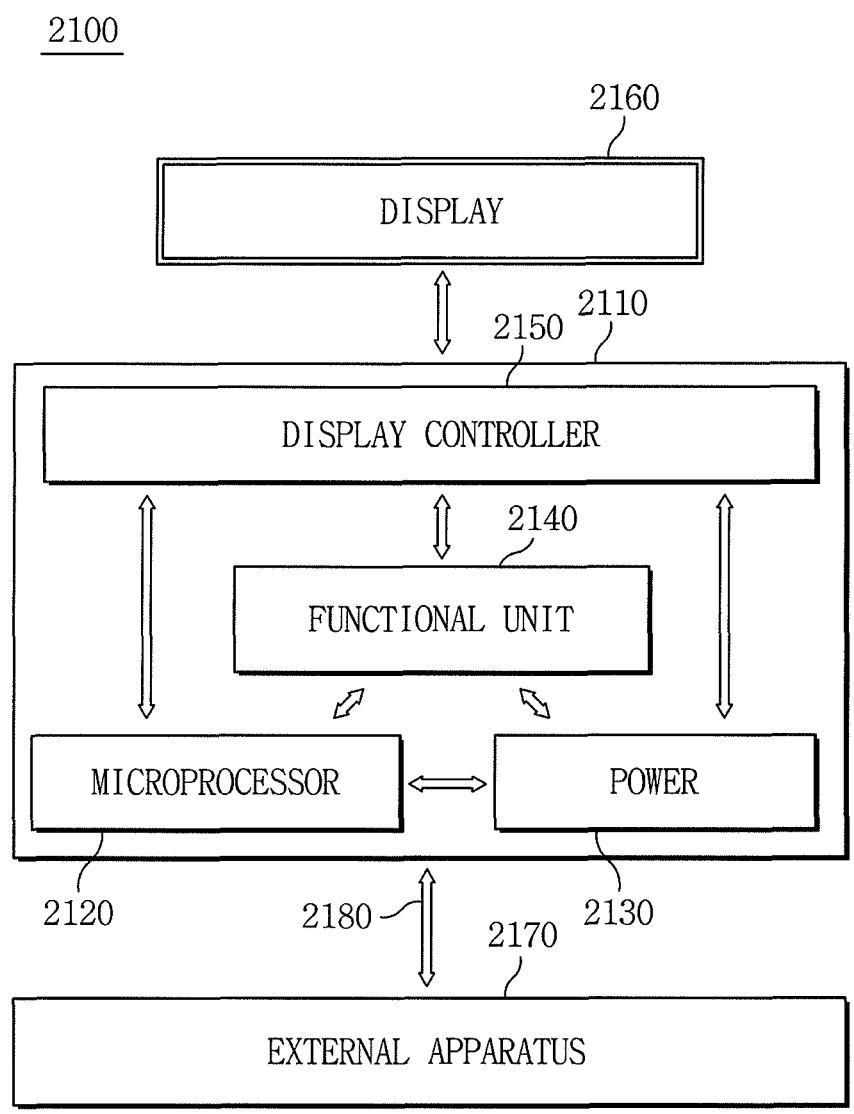
FIG. 37 is a system block diagram of an electronic device according to an exemplary embodiment of the inventive concept.

FIG. 37 is a system block diagram of an electronic device according to an exemplary embodiment of the inventive concept.

Referring to FIG. 37, a semiconductor device similar to that described with reference to FIGS. 1 to 36 may be variously applied to an electronic system 2100. The electronic system 2100 may include, for example, a body 2110, a micro processor unit 2120, a power unit 2130, a functional unit 2140, and a display controller unit 2150. The body 2110 may be a main board formed of, for example, a PCB. The micro processor unit 2120, the power unit 2130, the functional unit 2140 and the display controller unit 2150 may be mounted on the body 2110. A display unit 2160 may be mounted in or on the body 2110. For example, the display unit 2160 may be disposed on a surface of the body 2110 to display an image processed by the display controller unit 2150.

The power unit 2130 is supplied with a predetermined voltage from an external battery (not shown), and divides the voltage into a required voltage level to supply to the micro processor unit 2120, the functional unit 2140 and the display controller unit 2150. The micro processor unit 2120 may be supplied with a voltage from the power unit 2130 to control the functional unit 2140 and the display unit 2160. The functional unit 2140 may perform various functions of the electronic system 2100. For example, when the electronic device 2100 is a cellular phone, the functional unit 2140 may include various components capable of functioning as a cellular phone such as dialing, outputting an image on the display unit 2160 as a result of communication with an external apparatus 2170, and outputting voice through a speaker. Furthermore, when the external apparatus 2170 includes a camera module similar to that described with reference to FIGS. 35 and 36, the functional unit 2140 may function as a camera image processor.

In exemplary embodiments, when the electronic system 2100 is connected to a memory card for the capacity expansion, the functional unit 2140 may be a memory card controller. The functional unit 2140 may transmit or receive a signal to or from the external apparatus 2170 via a wired or wireless communication unit 2180. Moreover, when the electronic system 2100 requires a universal serial bus (USB) for the function expansion, the functional unit 2140 may function as an interface controller.

In exemplary embodiments, alternatively. a similar method of forming a semiconductor device to that described with reference to FIGS. 1 to 36 may be applied to the functional unit 2140. For example, the functional unit 2140 may include a semiconductor device having a similar constitution to that of FIG. 16. In this case, the through electrodes (53 of FIG. 16) may be electrically connected to the microprocessor unit 2120 via the connection patterns (57 of FIG. 16) and the body 2110.

According to exemplary embodiments of the inventive concept, a groove is formed in a scribe lane while a through hole is formed. The groove functions to prevent a chip crack of a semiconductor substrate while a sawing process is performed.

Accordingly, mass production efficiency of the sawing process can be significantly increased.

Having described exemplary embodiments of the inventive concept, it is further noted that various modifications can be made herein without departing from the spirit and scope of the invention as defined by the metes and bounds of the appended claims.

What is claimed is:

1. A method of forming a semiconductor device, comprising:
    preparing a semiconductor substrate having a plurality of chips formed on a first surface of the semiconductor substrate and a scribe lane disposed between the chips, wherein each of the chips includes a first insulating layer and a chip pad formed on the first insulating layer;
    attaching a light transmitting substrate to the first surface of the semiconductor substrate having the chips formed thereon;
    forming a mask pattern having first openings and second openings on a second surface of the semiconductor substrate located opposite to the first surface;
    simultaneously forming first grooves having a first depth in a center of the scribe lane, and through holes penetrating the semiconductor substrate and the first insulating layer and having a second depth greater than the first depth to expose the chip pad by etching the semiconductor substrate using the mask pattern as an etch mask;
    removing the mask pattern to expose the first grooves and the through holes;
    forming insulating spacers on sidewalls of the through holes;
    forming through electrodes filling the through holes;
    forming a second insulating layer covering the through electrodes;
    forming a plurality of connection patterns which penetrate the second insulating layer and which are disposed on a corresponding one of each of the through electrodes;
    using a sawing process to cut the semiconductor substrate and the light transmitting substrate along the first grooves to form lower grooves along bottoms of the first grooves, wherein the lower grooves penetrate the semiconductor substrate, the first insulating layer and the light transmitting substrate, and wherein a dicing film is exposed to bottoms of the lower grooves; and
    removing the dicing film to separate the chips.

2. The method of claim 1, further comprising forming a backside insulating layer covering the second surface of the semiconductor substrate prior to attaching the light transmitting substrate to the first surface of the semiconductor substrate having the chips formed thereon and wherein portions of the backside insulating layer are etched when forming the first grooves and the through holes.

3. The method of claim 1, further comprising forming an upper insulating layer having inner interconnections formed therein on the second surface of the semiconductor substrate prior to attaching the light transmitting substrate to the first surface of the semiconductor substrate having the chips formed thereon and wherein portions of the upper insulating layer are etched when forming the first grooves and the through holes.

4. The method of claim 1, wherein the light transmitting substrate is attached to the first surface of the semiconductor substrate using a bonding pattern, wherein the chips further include a micro lens, and wherein the micro lens is disposed between the semiconductor substrate and the light transmitting substrate.

5. The method of claim 1, wherein after removing the dicing film to separate the chips, the method further comprising: sequentially stacking the chips on a package substrate; attaching the connections patterns to first substrate pads of the package substrate and electrically connecting external terminals formed on the package substrate to the through electrodes; and forming a substrate insulating layer on a surface of the package substrate and covering the chips stacked on the package substrate with an encapsulating material.

* * * * *